United States Patent [19]

Hoshimi et al.

[11] 4,417,283
[45] Nov. 22, 1983

[54] DIGITAL SIGNAL PROCESSING SYSTEM

[75] Inventors: Susumu Hoshimi, Yokohama; Tadashi Kojima, Yokosuka, both of Japan

[73] Assignees: Sony Corporation; Tokyo Shibaura Denki Kabushiki Kaisha, both of Japan

[21] Appl. No.: 283,240

[22] Filed: Jul. 14, 1981

[30] Foreign Application Priority Data

Jul. 17, 1980 [JP] Japan .................................. 55-97777

[51] Int. Cl.³ ............................................. H04N 9/493
[52] U.S. Cl. ..................................... 358/310; 358/335; 358/339; 358/141; 358/12; 370/85
[58] Field of Search ............... 358/310, 335, 339, 146, 358/147, 141, 93, 12, 143; 370/85; 375/37

[56] References Cited

U.S. PATENT DOCUMENTS

| 3,743,767 | 7/1973 | Bitzer et al. | 358/93 |
| 3,789,137 | 1/1974 | Newell | 358/143 |
| 4,347,619 | 8/1982 | Dakin et al. | 358/141 |

Primary Examiner—Richard Murray
Attorney, Agent, or Firm—Hill, Van Santen, Steadman & Simpson

[57] ABSTRACT

A digital signal processing system in which the actual signal data obtained through digitalization of the information signal and control data of the digital control signals are used for the control of the actual signal data and are transmitted together with a sync signal between two circuits wherein the control data are provided to at least part of an actual signal data transmission line for transmitting the various data and the control data are transmitted during the period of absence of an actual signal data on the transmission line or during the period of the sync signal.

11 Claims, 13 Drawing Figures

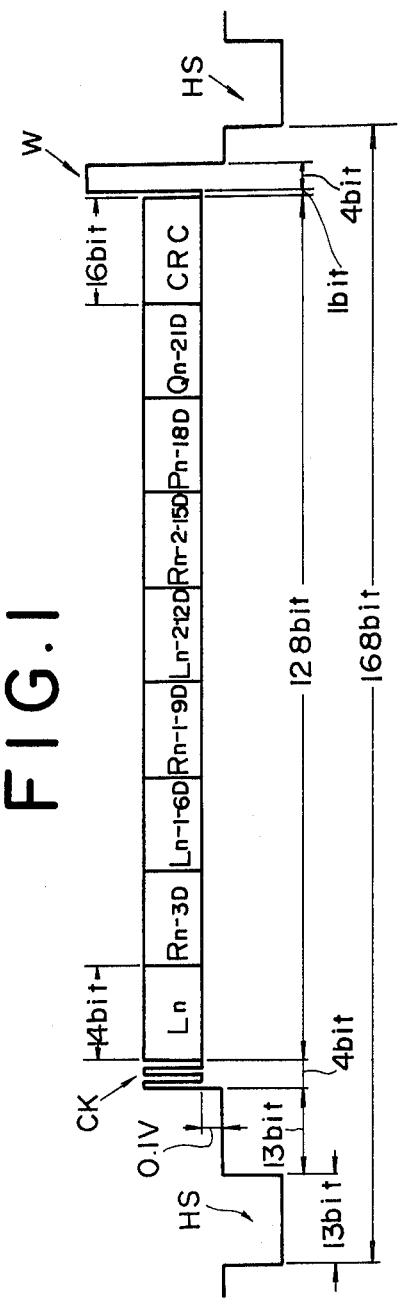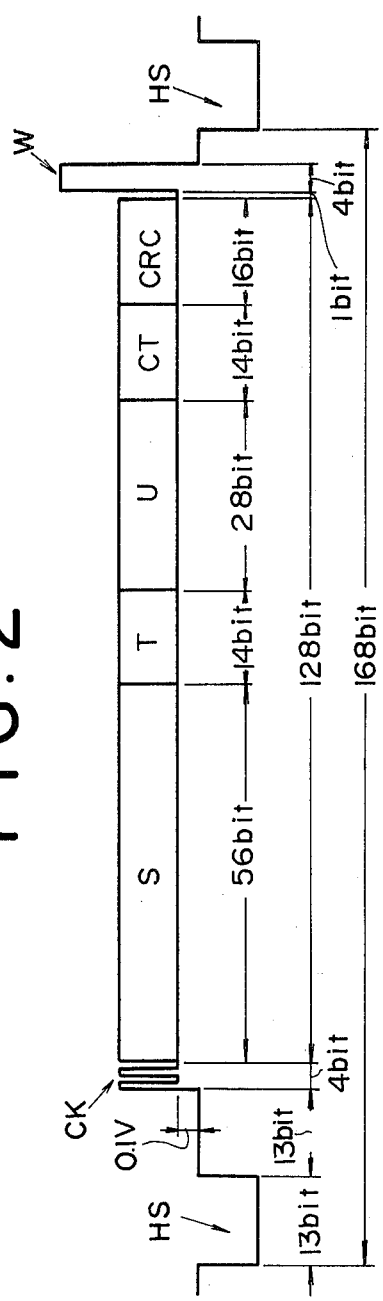

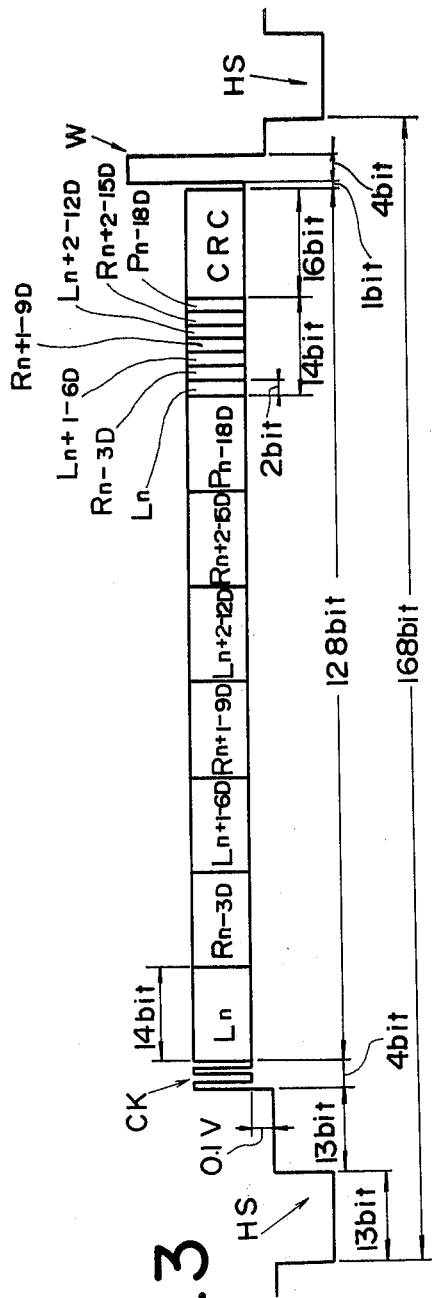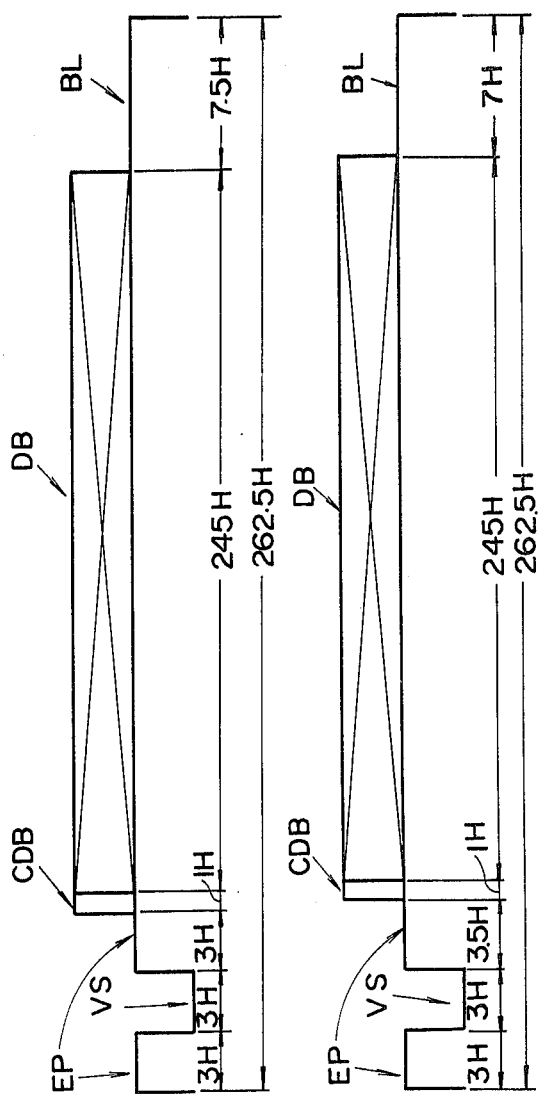

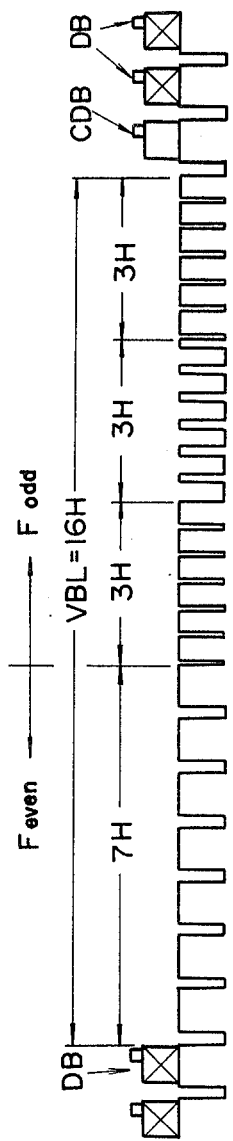
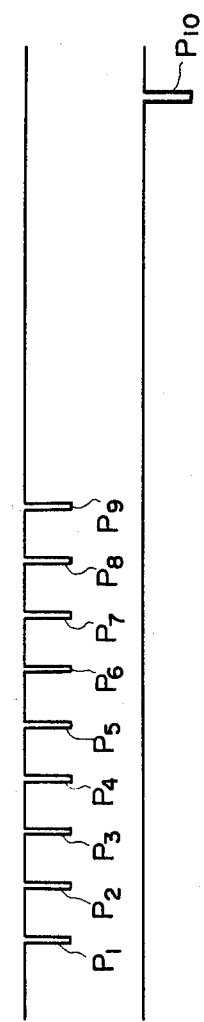
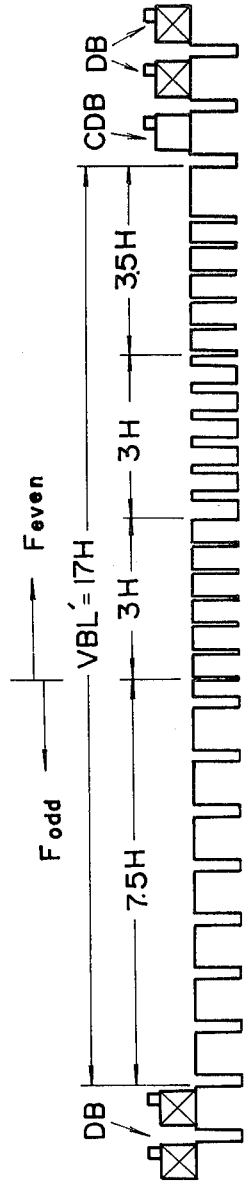
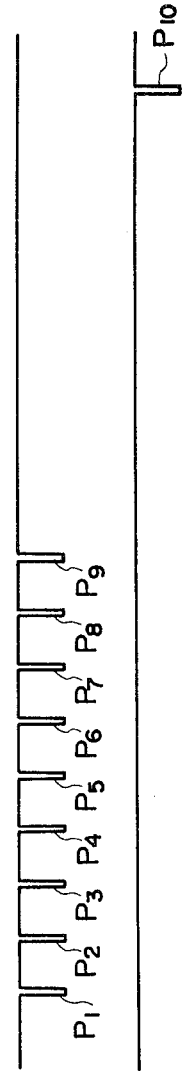
FIG.6A
FIG.6B
FIG.6C
FIG.7A
FIG.7B
FIG.7C

DIGITAL SIGNAL PROCESSING SYSTEM

BACKGROUND OF THE INVENTION

1. Field of the Invention

This invention relates in general to digital signal processing systems for processing signal data obtained by converting information signals such as audio signals to digital data for an instance from PCM signals and control data used for the discrimination of the type of signal data, control data and so forth.

2. Description of the Prior Art

When recording and reproducing audio signals for music or the like in the form of PCM signals with the usual home video tape recorder, it is necessary to convert a PCM audio signal into a signal having a data format conforming to the television signal of a standard system such as the NTSC system.

As an example of the conversion into PCM signal, 2-channel stereophonic audio signals are individually sampled at a sampling frequency of about 44 kHz, and one sample data (i.e., one word) is converted into a 16- or 14-bit PCM digital data, which is placed in a video signal portion of a standard television signal. FIG. 1 shows an example of the data format of one horizontal scanning period (1 H period) for the case where one word is the 14-bit data form mentioned above. In the data block for 1 H shown in FIG. 1, six words of PCM signals for the left and right channels are alternately arranged, with two error correction words P and Q and one 16-bit error detection word CRC all of which constitute a 9-word 128-bit data block. The PCM data L and R shown in FIG. 1 respectively correspond to the left and right sampled data, and suffixes attached represent the sampling order. In the format of FIG. 1, the data is interleaved such that in each sampled data the six words and two error correction words P and Q, i.e., a total of eight words, are successively shifted by 16 blocks (i.e., 16 horizontal lines) for each word, and D in the aforementioned suffixes represents this number of blocks (D=16) of the interleave. In this case, the interleave of D=16 blocks is equivalent to a word interleave of 3D=48 words.

In FIG. 1, the period of one horizontal line (1H) is constituted of 168 bits. In this 168-bit interval, the horizontal sync signal HS which has 13 bits is placed, then a 4-bit clock signal CK for synchronization of data is placed after an interval of 13 bits, and then the aforementioned 128-bit data block is placed. The code of the data synchronization signal CK is, for instance, "1010." Also, after the 128-bit data block a "0" signal of one bit is placed, and then a white reference signal W with a pulse width of 4 bits is placed.

FIG. 2 shows a 1 H period in which a control signal data block is contained. This format is the same as that of FIG. 1 except for the 128-bit control data block, including the horizontal sync signal HS and white reference signal W. The 128-bit control data block in this case is constituted by a 56-bit heading signal word S, a 14-bit content discrimination signal word T, a 28-bit address signal word U, a 14-bit control signal word CT and the aforementioned 16-bit error detection word CRC.

The content of the 14-bit control signal word CT is set as shown in Table 1.

TABLE 1

| Bit No. | Code Content | Control content | Bit content |
|---|---|---|---|
| 1 to 10 | No prescription | — | 0 |
| 11 | Dubbing inhibition code | Absent | 0 |
| 12 | p correction discrimination code | Present | 0 |
| 13 | Q correction discrimination code | Present | 0 |
| 14 | Pre-emphasis discrimination code | Present | 0 |

In Table 1, the Q correction discrimination code is "0" representing the "presence" for the case when the word of the PCM audio signal is constituted by 14 bits, while where one word is constituted by 16 bits, for instance as in the data format shown in FIG. 3, the Q correction discrimination code is "1" representing "absence."

FIG. 3 shows an example of the data block in which one word by the PCM audio signal mentioned above is constituted of 16 bits. Here, an 8-word, 128-bit data block is constituted by six 16-bit words of the left and right channel audio signal data L and R, a 16-bit error correction word P and a 16-bit error detection word CRC, i.e., a total of eight words.

In this format, the error correction word Q is omitted, and only a single error correction word P is used. In this case, in order to provide for the compatibility with respect to the aforementioned 14-bit data format, it is desirable to subdivide the 16-bit data for one word into, for instance, a 14-bit portion and a 2-bit portion and thereby retain a 14-bit unit pattern. In the format of FIG. 3, for instance, the 14-bit portions of the respective seven words, namely the six audio signal data words L and R and one error correction word P, are placed in the same position as the individual corresponding words in FIG. 1, and the remaining 2-bit portions of these seven words are then arranged in the same order as 14-bit data in the position of the error correction word Q in FIG. 1. The other signal components in the 1-H period such as the horizontal sync signal HS and white reference signal W are in the same arrangement as in the format of FIG. 1.

In order to provide the compatibility for the format where one word consists of 14 bits and the format where one word consists of 16 bits, it is desired to provide the circuit with the compatibility and also permit one sampled data of analog audio signal to be encoded in 16 bits and converted into a 14-bit word through processing in the circuit.

The above data signals for 1 H unit are arranged in one vertical scanning period filed in a manner as shown, for instance, in FIGS. 4A and 4B. FIG. 4A corresponds to an odd field, and FIG. 4B corresponds to an even field. At the outset of each field, the equivalent pulse EP and vertical sync signal VS are arranged, the control signal block CDB is provided in the 10-th horizontal line in the odd field (see FIG. 4A) and in the 10.5-th horizontal line in the even field (see FIG. 4B), and then 245 horizontal lines with data block DB are provided, the remaining horizontal lines constituting a blank period BL.

Of the 262.5 horizontal lines constituting one field in FIGS. 4A and 4B, the 16.6 lines other than the 246 lines in which the aforementioned control signal block CDB and data block DB are provided correspond to the vertical blanking period of the standard television signal.

SUMMARY OF THE INVENTION

When recording and reproducing the PCM audio signal of a format such as described above using the usual home video tape recorder or the like, complicated technology for the digital signal processing is required in the playback, but owing to recent advances in the semiconductor arts it is possible to construct the main part of the circuitry as a high density integration circuit, i.e., by using only several commonly termed LSI (large Scale Integration) elements. In such LSI element, however, the package size is the main factor of determining the price of the element, and the price will be increased with an increased number of pins, and thus it is very important to avoid increasing the number of pins.

The invention in view of these facts has an object to reduce the number of pins of the LSI element and provide an inexpensive system for permitting the transmission of data to and from the LSI element to be accomplished by using part of the data bus for transmitting actual signal data obtained through digitalization of the aforementioned audio signal also as the input/output lines for the control signal data.

Another object of the invention is to permit the processing of the control data without altering it or the timing of the actual signal data by providing the control data to the data bus during the sync signal period of the digital signal or like period during which the actual signal data is not being processed.

A further object of the invention is to avoid influence upon the input and output of the actual signal by connecting a commonly termed tri-state buffer, which can take, in addition to "H" and "L" signal level states, a further state, i.e., a floating state, to the data bus such that the control data is transmitted through such tri-state buffer and wherein the tri-state buffer is held in the floating state during periods other than when the control data is transmitted.

A feature of the digital signal processing system according to the invention, accordingly, resides in that when processing a digital signal, which includes actual signal data having direct bearing upon an audio signal or other information signals and control data used for the control of switching of circuit functions, discrimination of data formats, etc. such as the PCM audio signal, the control data is at least partly transmitted over at least a portion of the transmission line for the actual signal data (i.e., data bus) to or from the LSI element while the input/output processing of the control data is accomplished during the period when the actual signal data is absent from the transmission line such as during the vertical blanking period.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure, and in which:

BRIEF DESCRIPTION OF THE DRAWINGS

FIG. 1 illustrates a data format for stereo signals,
FIG. 2 illustrates another data format,
FIG. 3 illustrates a data format,
FIG. 4 illustrates an odd field data format,
FIG. 4B illustrates an even field data format,
FIGS. 6A, 6B and 6C illustrate data formats for explaining the invention,
FIGS. 7A, 7B and 7C illustrate data formats for explaining the invention.

DESCRIPTION OF THE PREFERRED EMBODIMENTS

Figure 5:
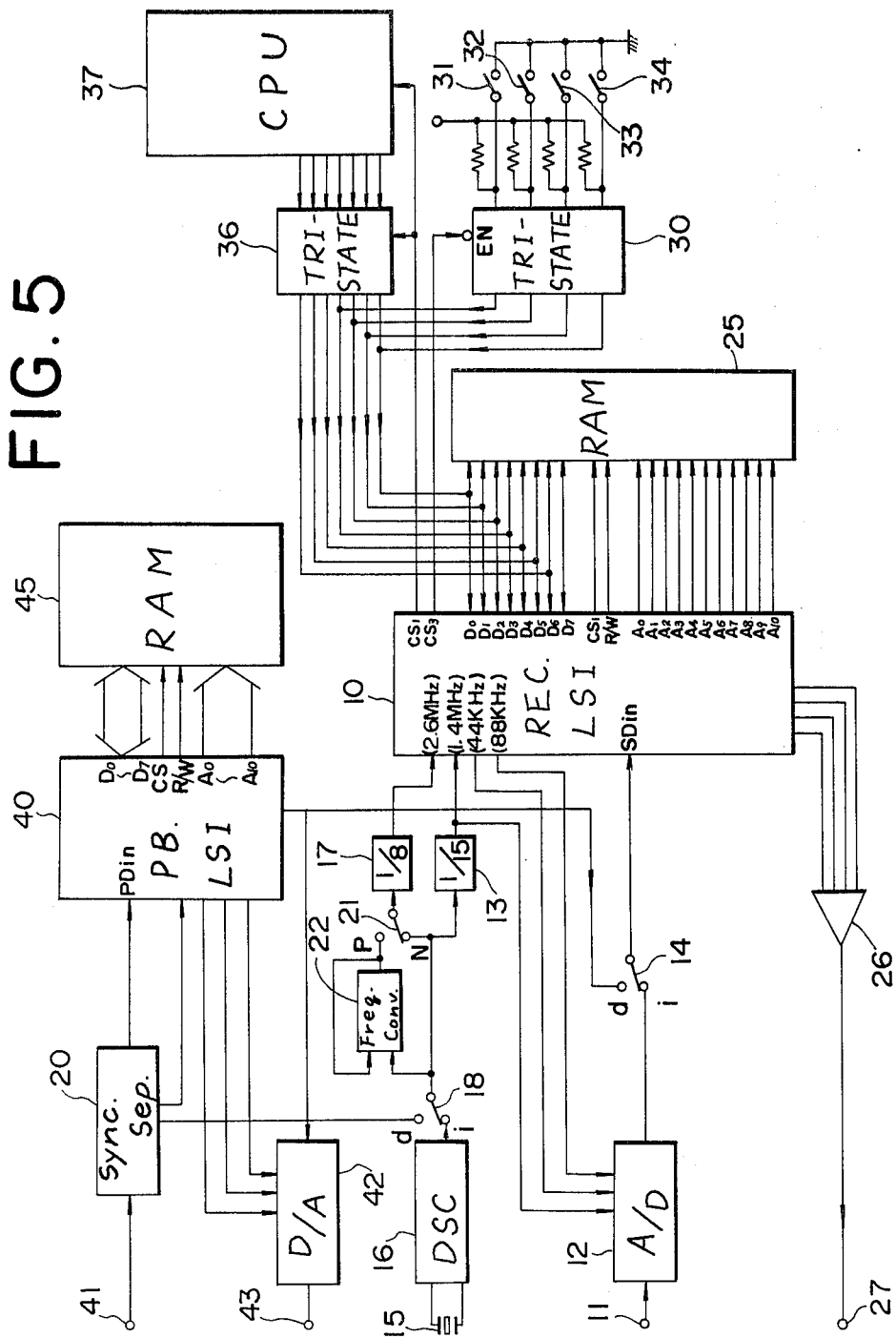
FIG. 5 is a block diagram illustrating an embodiment of the invention.

FIG. 5 is a block circuit diagram showing a complete embodiment of the invention, in which control data is provided as part of 8 bits $D_0$ to $D_7$ of a PCM audio signal recording LSI (hereinafter referred to as a recording LSI) 10, in particular to the four pins $D_0$ through $D_3$.

In FIG. 5, an analog audio signal is supplied from an analog input terminal 11 to an analog-to-digital converter (hereinafter referred to as A/D converter) 12 where it is converted into a PCM digital audio signal. The A/D converter 12 samples, for instance, two-channel audio signals respectively corresponding to left and right stereo channels alternately, i.e., at different timings at a sampling frequency of about 44 kHz, and converts each sampled data (i.e., one word) into a 16-bit digital code data word. The clock frequency of the data is about 1.4 MHz (i.e., 1.4 Mbits/sec.), and such 1.4-MHz bit clock signal is supplied from a frequency divider 13 to converter 12. The A/D converter 12 also is supplied a word clock signal (at about 44 kHz) for the sampling and a double frequency word clock signal (at about 88 kHz) from the recording LSI 10. The PCM audio signal containing words each of 16 bits, provided from the A/D converter 12, is supplied through a switch 14 to a serial data input terminal $SD_{in}$ of the LSI 10. The switch 14, which is switched to contact its terminal d at the time of dubbing signals, is normally set to its terminal i to couple the output of the A/D converter 12 to the LSI 10.

The clock supply for the LSI 10 is accomplished by frequency dividing a signal, for instance at about 21 MHz, from an oscillator 16 which has a crystal oscillator element 15 and oscillator 16 is connected through frequency dividers 13 or 17 to LSI 10. A switch 18, which is connected to the output of the oscillator 16, is switched to its terminal d to receive a signal from a sync separation circuit 20 during dubbing, but switch 18 is normally set to its terminal i to couple the signal from the oscillator 16 to the frequency divider 13. The frequency divider 13 divides the frequency of the signal at about 21 MHz from the oscillator 16 by 15, thus providing a bit block signal at about 1.4 MHz, which is supplied to the A/D converter 12 and to the recording LSI 10. The frequency divider 17 is a ⅛ frequency divider, and supplies a bit clock signal at about 2.6 MHz to the recording LSI 10. A switch 21, which is connected to the input side of the frequency divider 17, is set to its terminal N when the standard television signal is of the NTSC system format and it is set to its terminal P when the PAL system format is present. In the case of the PAL system, the output of the oscillator 16 is frequency converted in a frequency converter 22, which includes a PLL circuit and other circuits, and the terminal P of the switch 21 supplies its output to the ⅛ frequency divider 17. The oscillator 16 can also be tuned to provide slightly different frequencies for the NTSC and PAL systems.

The recording LSI 10 has 11 address terminals $A_0$ to $A_{10}$, 8 data terminals $D_0$ to $D_7$, three chip select terminals $CS_1$ to $CS_3$ and a read/write terminal R/W. Address terminals $A_0$ to $A_{10}$ and data terminals $D_0$ to $D_7$ are all connected through respective address bus lines and data bus lines to corresponding terminals of a random access memory (hereinafter referred to as RAM) 25 for writing and reading data in and out. The RAM 25 may be, for instance, a static RAM of 16 Kbits (8 bits×2048), and it is selected by the output from the chip select terminal $CS_1$ of the recording LSI 10 for writing or reading depending upon the output from the read/write terminal R/W.

To the serial data input terminal $SD_{in}$ of the recording LSI 10 is supplied serial data of about 1.4 Mbits/sec. solely consisting of actual signal data with each word of 16 bits, and the recording LSI 10 supplies this serial data for every 8 bits as 8-bit parallel data to the RAM 25 so it will be written therein. The write pulse signal at this time is at about 2.8 μsec., and the reading of data from the RAM 25 occurs with a timing not overlapping the write pulses (i.e., between adjacent write pulses). At this time, the recording LSI 10 effects reading of data according to the aforementioned word interleave, accomplishes processing of the error correction words P and Q and the error detection word CRC, and further adds the sync signal. Thus, it effects conversion of data into the data format conforming to the standard television signal as shown in FIGS. 4A or 4B to provide serial data at about 2.6 Mbits/sec.

In the recording LSI 10 of the disclosed embodiment, the data block DB or CDB, the white reference signal W, the level shift portion between adjacent data sections (the shift being made by, for instance, about 0.1 V), the sync signal HS, etc. which are the components of the format shown in FIGS. 1 or 2 are respectively supplied from independent output terminals and are added together in an adder amplifier 26 to form the aforementioned serial data signal at about 2.6 Mbits/sec. which is supplied to an output terminal 27.

At least some of the data buses connected to the data terminals $D_0$ to $D_7$ which constitute the I/O port of the recording LSI 10, such as 4 data lines corresponding to the terminals $D_0$ to $D_3$, are connected to respective 4 output terminals of a tri-state buffer circuit 30, and switches 31 to 34 are connected to 4 input terminals of the tri-state buffer circuit 30. The switches 31 to 34 control data input switches, and they correspond to, for instance, the emphasis discrimination data, the Q correction word discrimination data, the NTSC/PAL discrimination data and the dubbing inhibition discrimination data respectively. When the switches 31 to 34 are all "open", the 4 outputs of the tri-state buffer circuit 30 are all at "H" levels, that is, they represent the "presence" of emphasis, "presence," of Q correction word, selection of NTSC system and "absence" of dubbing inhibition respectively. Of these four control data, the three concerning emphasis, Q correction and dubbing inhibition respectively, are placed in predetermined bit positions of the control signal word CT of the control data block CDS mentioned above, and their bit contents are all "0." When one of the switches 31 to 34 is "closed", the corresponding output of the tri-state buffer circuit 30 is changed to an "L" level, and the content of the corresponding bit of the control signal word CT is changed to "1." The P correction discrimination code in the control signal word CT is forcibly set to "0."

The tri-state buffer circuit 30 can take three different states, namely the two states where the output signal level is respectively "H" (high level) and "L" (low level) and a floating state where the output impedance is substantially infinite, i.e., the output line is disconnected. Of these states, the switching between the operative state where the output is "H" or "L" and the aforementioned floating state is accomplished with an enable signal supplied to an enable terminal EN of the tri-state buffer circuit 30. The output of the chip select terminal $CS_3$ of the recording LSI 10 is supplied to the enable terminal EN.

When the tri-state buffer circuit 30 is placed in the aforementioned operative state by the output from the chip select terminal $CS_3$, it supplies an "H" or "L" control data signal through the four lines to the terminals $D_0$ to $D_3$ of the recording LSI 10. At this time, the aforementioned signal data should not exist on the data bus, and according to the invention the chip select signal from the chip select terminal $CS_3$ is provided during the vertical blanking period or horizontal sync signal period in the data format mentioned above. The control data from the tri-state buffer circuit 30 is partly placed in the control signal block CDB shown in FIGS. 4A or 4B, so that it has to be supplied to the recording LSI 10 before the control signal block CDB is provided.

In the control signal block CDB, the 56-bit heading signal word S, the 14-bit content discrimination signal word T, the 28-bit address signal word U, the 14-bit control signal word CT and the 16-bit error detection word CRC are as shown in FIG. 2. Of these words, the content of the heading signal S is preset to, for instance, "11001100 ... 1100," and the error detection word RC is determined on the basis of a total of 112 bits of the other words of the block. Thus, while the externally controllable words are the content discrimination signal word T, the address signal word U and the control signal word CT, a total of 56 bits, the most important are the lower 4 bits in the control signal word CT (bit Nos. 11 to 14 in Table 1). Therefore, no problems arise in operation if the 52 bits other than the aforementioned 4 bits of the control signal word CT are all set to "0."

When signal processing occurs at a high degree such as when editing the PCM audio signal or when adding special effects thereto, however, predetermined contents have to be written into the content such as the discrimination word T, the address signal word U, etc., and it is thus necessary to supply these contents to the recording LSI 10. To this end, the data terminals $D_0$ to $D_6$ are connected through a tri-state buffer circuit 36 with latch function to the data input/output terminals of a CPU 37 forming a microcomputor, and the output of the chip select terminal $CS_2$ of the recording LSI 10 is supplied to the tri-state buffer circuit 36 and to the enable terminal of the CPU 37. The output of the chip select terminal $CS_2$ is provided during a period, during which no data from the RAM 25 is being read out from the recording LSI 10, for instance during the aforementioned vertical blanking period.

FIGS. 6A, B and C and 7A, B and C show time charts in the neighborhood of the vertical blanking period. FIGS. 6A and 7A show the data signal from the output terminal 27. FIGS. 6B and 7B show the output signal from the chip select terminal $CS_2$. FIGS. 6C and 7C show the output signal from the chip select terminal $CS_3$. FIGS. 6A, B and C show a vertical blanking period VBL of 16 horizontal lines after an even field $F_{even}$ and before an odd field $F_{odd}$, and FIGS. 7A, B and C show the vertical blanking period VBL' after an odd field $F_{odd}$ and before an even field $F_{even}$. During these periods VBL and VBL', the reading of data from the RAM 25 is inhibited.

In FIGS. 6A, 6B and 6C or 7A, 7B and 7C, in the 1 H period 9 successive pulses are provided from the chip select terminal $CS_2$ with a delay time of, for instance 0.5 H with respect to the starting instant of the vertical blanking period VBL or VBL'. Of these 9 successive pulses $P_1$, $P_2$, ... $P_9$, the first pulse $P_1$ is used, for instance, for the time matching or stand-by mode of the CPU 37, and at this time the aforementioned control data is not supplied. At the time of appearance of the next pulses $P_2$ and $P_3$, the 14-bit content of the content discrimination signal word T is supplied as 7-bit parallel data from the CPU 37 through the tri-state buffer circuit 36 to the recording LSI 10. At the time of appearance of the pulses $P_4$, $P_5$, $P_6$ and $P_7$, the 28-bit content of the address signal word U is supplied as respective four 7 bit parallel data. At the time of appearance of the pulses $P_8$ and $P_9$, the 14-bit content of the control signal word CT is supplied as two 7-bit parallel data.

Shown in FIGS. 6C or 7C is the output of the chip select terminal $CS_3$, which is a pulse $P_{10}$ which is provided before the control signal block CDS, for instance in the immediately preceding period of the horizontal sync signal HS. At the time of the appearance of the pulse $P_{10}$, the 4-bit data from the tri-state buffer circuit 30 is supplied to the $D_0$ to $D_3$ terminals of the recording LSI 10. In the usual PCM audio signal processing system, it is sufficient to supply only the control data from the tri-state buffer circuit 30, and the supply of the control data from the CPU 37 is not always necessary.

Further, the pulses $P_1$ to $P_{10}$ are provided with the timing for reading out data to the recording LSI 10 (data input), and this data input timing may be made to have a fixed phase difference with respect to the aforementioned write pulse (with a cycle period of 2.8 μsec.), for instance may be delayed thereafter by one half the cycle period, i.e., 1.4 μsec. This is equal to the timing relationship between the read timing and write timing with respect to the RAM 25; since no read pulse is provided during the aforementioned blanking period. The pulses $P_1$ to $P_{10}$ may be provided with a timing corresponding to the aforementioned read timing.

The construction of the playback side of the system showing FIG. 5 will be described. The playback PCM audio signal from the video tape recorder is supplied through a playback signal input terminal 41 to the sync separator 20, in which the data signal is separated from the sync signal and clock signal components. The data signal component is supplied to a $PD_{in}$ terminal of a playback LSI 40, and the sync signal and clock signal components are supplied to the playback LSI 40 and to the dubbing terminal d of the switch 18. The playback LSI 40 accomplishes an operation inverse to the aforementioned interleave and de-interleave and also corrects errors on the basis of the PCM audio signal data of the format conforming to the standard television signal, thus providing substantially continuous digital data free from blank portions corresponding to the sync signal or the like, which is supplied to a digital-to-analog (D/A) converter 42. The D/A converter 42 converts such digital data into the original analog audio signal which is supplied to an output terminal 43.

The playback LSI 40 has its data input/output terminals $D_0$ to $D_7$, and address output terminals $A_0$ to $A_{10}$ connected through respective data buses and address buses to the RAM 45, and as in the recording side various control data can be transmitted through these data buses.

Figure 8:
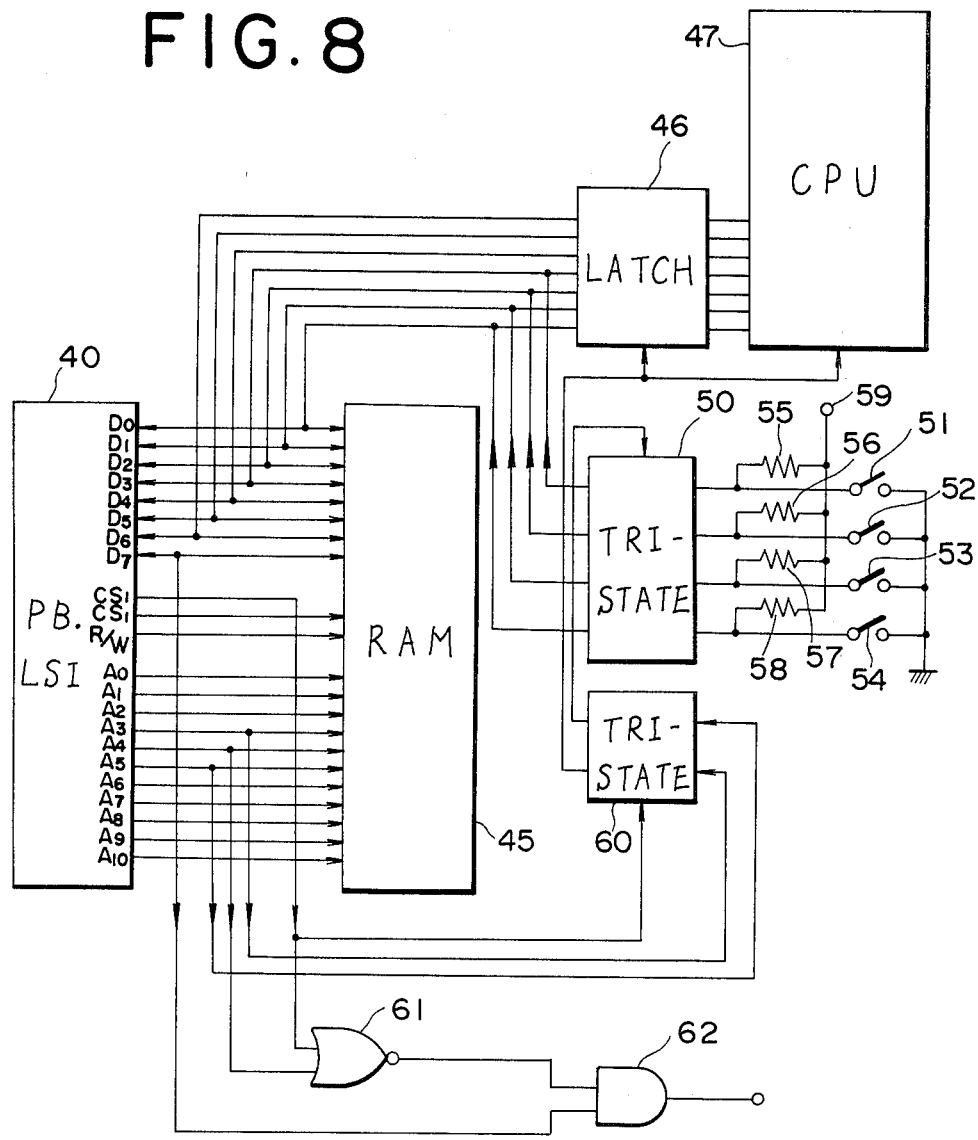
FIG. 8 is a block diagram of a circuit for supplying control data in the invention.

FIG. 8 shows a circuit diagram of an example of a construction of a circuit for supplying control data to the data terminals $D_0$ to $D_7$ of the playback LSI 40.

In FIG. 8, in addition to the aforementioned data buses and address buses, the chip select terminal $CS_1$ and the read/write terminal R.W of the playback LSI 40 are connected to respectively corresponding terminals of an RAM 45. Of the data bus mentioned above, 7 lines are used for the respective terminals $D_0$ to $D_6$ which are connected through the latch circuit 46 to a CPU 47 forming a microcomputer. Some of these data lines, namely the 4 lines $D_0$ to $D_3$, are connected to a 4-output tri-state buffer circuit 50, and switches 51 to 54 are connected to respective 4 input terminals of the tri-state buffer circuit 50. These switches operate as follows. The switch 51 switches the NTSC and PAL systems and for the PAL system it is turned "on," and for the NTSC system it is turned "off." When the switch 52 is turned "on," a through rate limiting circuit is rendered operative. When the switch 53 is turned "on," the through rate limiting circuit is rendered operative only in the presence of a muting output. When the switch 54 is "on," the through rate limiting circuit is "on" only when the muting output is present. When three successive errors of the de-interleave signal occur, the through rate limiting circuit is rendered operative although the muting output does not appear.

The tri-state buffer circuit 50, to which the switches 51 and 54 are connected, has its 4 input terminals connected through respective pull-up resistors 55 through 58 to a power supply terminal 59 of, for instance, +15 V. To the enable terminal of a 2-input 2-output tri-state buffer circuit 60 is supplied the output from the second chip select terminal $CS_2$. As mentioned earlier, the pulse from the chip select terminal $CS_2$ is provided during the period during which no actual signal data is transmitted to the data bus, thus rendering the tri-state buffer circuit 60 operative. The outputs from the address terminals $A_3$ and $A_5$ are supplied to the two input terminals of the tri-state buffer circuit 60. The two outputs of the tri-state buffer circuit 60 corresponding to these inputs are respectively supplied to the latch circuit 46 to the clock input terminal of the CPU 47 and to the enable terminal of the 4-input 4-output tri-state buffer circuit 50. The output of the address terminal $A_4$ of the playback LSI 40 and the output of the chip select terminal $CS_2$ are NORed through a NOR circuit 61 to an AND circuit 62. The output of the data terminal $D_7$ is supplied to the AND circuit 62. In the timing when the output of the NOR circuit 61 becomes "H" the output of the terminal $D_7$ is either "L" or "H" depending upon whether the detected data at the time of the error detection made by the CRC is correct, and errors in the data currently being processed can thus be checked from the output of the AND circuit 62.

As has been made apparent in the foregoing, while the reading of data from the RAM 25 by the recording LSI 10 is always accomplished, the writing is not effected during the aforementioned vertical blanking period. During this blanking period, pulses are provided from the chip select terminals $CS_2$ and $CS_3$, as shown in FIGS. 6B and 6C or FIGS. 7B and 7C, permitting the reading of control data to the recording LSI 10 through the data bus. The playback LSI 10 can entirely provide the reverse operation so as to process the control data through the data buses during the vertical blanking period. Thus, it is not necessary to provide any exclusive pin for control data.

Although the invention has been described with respect to preferred embodiments, it is not to be so limited as changes and modifications can be made which are within the full intended scope of the invention as defined by the appended claims.

We claim as our invention:

1. A circuit arrangement for processing analog audio data into a format for transmitting, receiving and playing back in a video format comprising, an analog to digital converter receiving said analog audio data, a large scale integration circuit with clock, read-write, input, output, chip select, data and address terminals, receiving the output of said analog to digital converter, a random access memory connected to said read-write, data and address terminals of said large scale integration circuit, a first tri-state buffer attached to supply outputs to certain of said data terminals of said large scale integration circuit and receiving an input from one of said chip select terminals and a first plurality of switches connected to said first tri-state buffer.

2. A circuit arrangement according to claim 1 wherein said first tri-state buffer can take a high or low state depending upon the positions of said first plurality of switches.

3. A circuit arrangement according to claim 2 wherein said first tri-state buffer can take a floating state when it receives an input from said one chip select terminal.

4. A circuit arrangement according to claim 3 including an oscillator which supplies clock inputs to said large scale integration circuit and to said analog to digital converter.

5. A circuit according to claim 4 including a second tri-state buffer connected to certain of said data terminals and a chip select terminal of said large scale integration circuit and a microcomputer connected to said second tri-state buffer.

6. A circuit according to claim 5 including a playback input terminal which receives a playback signal, a sync separator connected to said playback input terminal, a first dubbing input switch connected to said sync separator, said oscillator and to said clock terminal of said large scale integration circuit, a playback large scale integration circuit receiving an output of said sync separator and a second random access memory connected to said playback large scale integration circuit.

7. A circuit according to claim 6 including a second dubbing/input switch connected to said analog to digital converter, to said playback large scale integration circuit and to the input terminal of said large scale integration circuit.

8. A circuit according to claim 7 including a third dubbing/input switch connected to said oscillator to change the frequency of the clock signal to said large scale integration circuit for NTSC and PAL television signal formats.

9. A circuit according to claim 7 including a latch circuit connected to said playback large scale integration circuit, and a second microcomputer connected to said latch circuit.

10. A circuit according to claim 9 including a third tri-state buffer with a plurality of switches connected to said second random access memory and said playback large scale integration circuit.

11. A circuit according to claim 10 including a buffer connected to said playback large scale integration circuit to said third tri-state buffer, to said latch circuit and to said second microcomputer.

* * * * *